(12) United States Patent
Fuergut et al.

(10) Patent No.: US 10,418,313 B2
(45) Date of Patent: Sep. 17, 2019

(54) ELECTRONIC MODULE COMPRISING A PLURALITY OF ENCAPSULATION LAYERS AND A METHOD FOR PRODUCING IT

(71) Applicant: Infineon Technologies Austria AG, Fillach (AT)

(72) Inventors: Edward Fuergut, Dasing (DE); Martin Gruber, Schwandorf (DE); Juergen Hoegerl, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 248 days.

(21) Appl. No.: 14/876,624

(22) Filed: Oct. 6, 2015

(65) Prior Publication Data

US 2016/0099207 A1 Apr. 7, 2016

(30) Foreign Application Priority Data

Oct. 7, 2014 (DE) .................. 10 2014 114 520

(51) Int. Cl.
 *H01L 23/498* (2006.01)
 *H01L 23/31* (2006.01)
 (Continued)

(52) U.S. Cl.
 CPC ...... *H01L 23/49838* (2013.01); *H01L 21/565* (2013.01); *H01L 23/3121* (2013.01); *H01L 23/49822* (2013.01); *H01L 23/49827* (2013.01); *H01L 23/5383* (2013.01); *H01L 23/5384* (2013.01); *H01L 23/5389* (2013.01); *H01L 24/19* (2013.01); *H01L 24/24* (2013.01); *H01L 24/82* (2013.01); *H01L 24/97* (2013.01); *H01L 21/486* (2013.01); *H01L 21/4853* (2013.01); *H01L 21/4857* (2013.01); *H01L 21/568* (2013.01); *H01L 23/3135* (2013.01); *H01L 23/4334* (2013.01); *H01L 23/49866* (2013.01); *H01L 2224/04105* (2013.01);
 (Continued)

(58) Field of Classification Search
 CPC .......... H01L 23/49838; H01L 23/3114; H01L 23/3185; H01L 23/13; H01L 23/49833; H01L 23/5389; H01L 23/49816
 See application file for complete search history.

(56) References Cited

U.S. PATENT DOCUMENTS 8,357,950 B2 * 1/2013 Ikehara .................. H01L 24/29
                                              257/100
9,059,155 B2 * 6/2015 Ewe ........................ H01L 24/20
 (Continued)

FOREIGN PATENT DOCUMENTS

| DE | 102010038154 A1 | 5/2011 |
|----|-----------------|--------|
| DE | 102014102910 A1 | 9/2014 |
| WO | 2011055984 A2   | 5/2011 |

*Primary Examiner* — Jose R Diaz
(74) *Attorney, Agent, or Firm* — Murphy, Bilak & Homiller, PLLC

(57) ABSTRACT

An electronic module includes a first insulation layer, at least one carrier having a first main surface, a second main surface situated opposite the first main surface, and side surfaces connecting the first and second main surfaces to one another, at least one semiconductor chip arranged on the second main surface of the carrier, wherein the semiconductor chip has contact elements, and a second insulation layer, which is arranged on the carrier and the semiconductor chip.

14 Claims, 8 Drawing Sheets

(51) Int. Cl.
    *H01L 21/56*     (2006.01)
    *H01L 23/538*     (2006.01)
    *H01L 23/00*     (2006.01)
    *H01L 21/48*     (2006.01)
    *H01L 23/433*     (2006.01)

(52) U.S. Cl.
    CPC .......... *H01L 2224/12105* (2013.01); *H01L 2224/24137* (2013.01); *H01L 2224/24226* (2013.01); *H01L 2224/32245* (2013.01); *H01L 2224/73267* (2013.01); *H01L 2224/82039* (2013.01); *H01L 2224/8382* (2013.01); *H01L 2224/8384* (2013.01); *H01L 2224/92244* (2013.01); *H01L 2224/97* (2013.01)

(56) References Cited

U.S. PATENT DOCUMENTS

| | | | |
|---|---|---|---|
| 9,093,416 B2* | 7/2015 | Mengel | H01L 24/19 |
| 9,330,994 B2* | 5/2016 | Camacho | H01L 21/56 |
| 9,385,102 B2* | 7/2016 | Lin | H01L 24/19 |
| 9,449,908 B2* | 9/2016 | Huang | H01L 23/3114 |
| 2002/0020897 A1 | 2/2002 | Yamashita et al. | |
| 2010/0001306 A1* | 1/2010 | Park | H01L 33/60 257/99 |
| 2011/0074000 A1* | 3/2011 | Jaeger | H01L 23/49861 257/676 |
| 2013/0010046 A1 | 1/2013 | Taguchi et al. | |
| 2014/0252577 A1 | 9/2014 | Otremba et al. | |
| 2014/0264790 A1* | 9/2014 | Ewe | H01L 23/49575 257/666 |

* cited by examiner

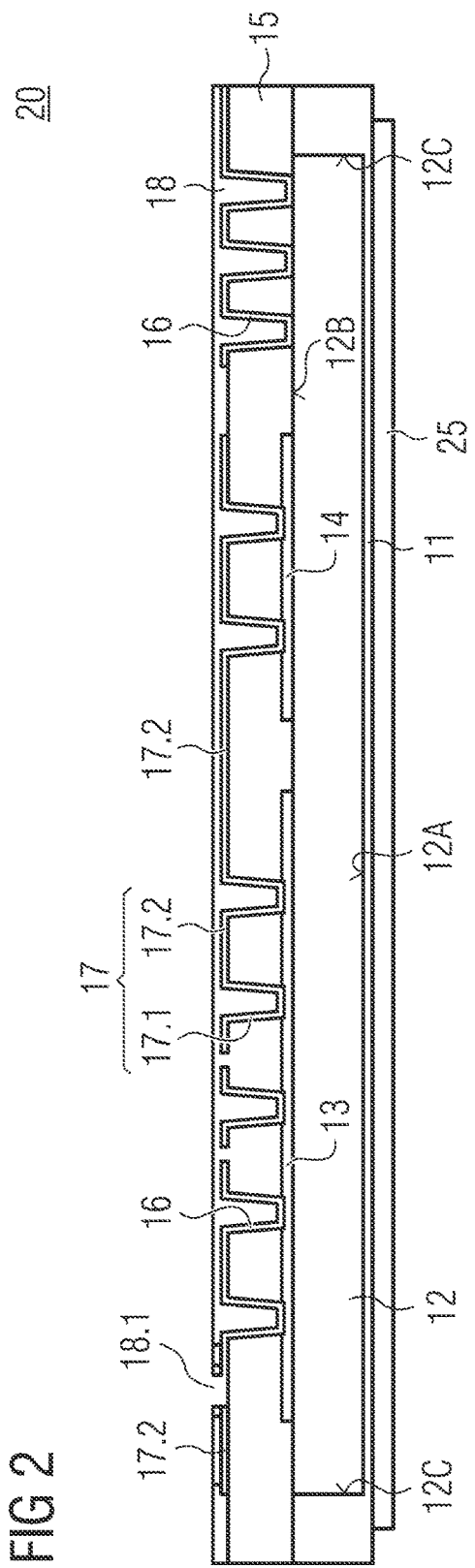

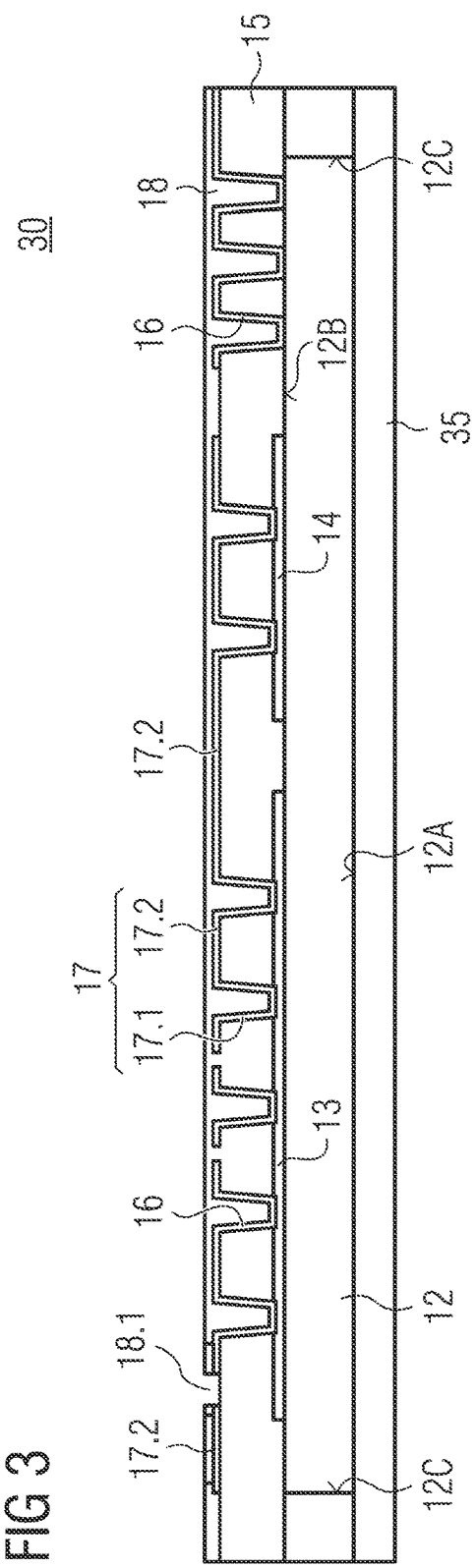

or thermally insulating insulation layer and a moulding material is then applied after the chips have been applied.

ELECTRONIC MODULE COMPRISING A PLURALITY OF ENCAPSULATION LAYERS AND A METHOD FOR PRODUCING IT

PRIORITY CLAIM

This application claims priority to German Patent Application No. 10 2014 114 520.8 filed on 7 Oct. 2014, the content of said application incorporated herein by reference in its entirety.

FIELD OF THE INVENTION

The embodiments described in this application relate generally to electronic modules and in particular to semiconductor power chip modules such as, for instance, those used in power converter circuits, and to a method for producing an electronic module.

BACKGROUND

In many electronic systems it is necessary to use converters such as DC/DC converters, AC/DC converters or DC/AC converters in order to generate the currents, voltages and/or frequencies that are intended to be used by an electronic circuit such as a motor drive circuit, for instance. The converter circuits, as mentioned previously, in general comprise one or a plurality of half-bridge circuits, wherein each is provided by two semiconductor power switches such as, for instance, power MOSFET components, for example, and further components such as diodes, for instance, which are connected in parallel with the transistor components, and passive components such as, for instance, an inductance and a capacitance. The switching of the power MOSFET components can be controlled by a semiconductor control chip. The plurality of components of the converter circuit can be provided, in principle, as individual components that are mounted on a printed circuit board. Alternatively, some or all of the components can be accommodated in an individual housing in order to form a multi-chip module, which can afford an advantage in so far as the mounting of the entire converter circuit on the circuit board is simplified and the space required on the circuit board can be reduced. However, an important problem remains with regard to forming the interconnects between the transistors, the diodes and the passive components. In particular, there is a specific requirement to provide semiconductor chip modules having short interconnects which are accompanied by low parasitic inductances, and in addition to provide a semiconductor power module which has improved heat dissipation properties or satisfies the latter.

BRIEF SUMMARY OF THE EMBODIMENTS

In accordance with one embodiment of an electronic module, the electronic module includes a first insulation layer, at least one carrier having a first main surface, a second main surface situated opposite the first main surface, and side surfaces connecting the first and second main surfaces to one another. The first main surface and the side surfaces are covered by the first insulation layer. At least one semiconductor chip is arranged on the second main surface of the carrier. The semiconductor chip has contact elements. A second insulation layer is arranged on the first insulation layer, the carrier and the semiconductor chip.

In accordance with a further embodiment of an electronic module, the electronic module includes a carrier having a first main surface and a second main surface situated opposite the first main surface, and side surfaces connecting the first main surface and the second main surface, a first semiconductor chip, which is arranged on the carrier, a second semiconductor chip, which is arranged on the carrier, a first insulation layer, which embeds the carrier, and a second insulation layer, which is arranged on the first semiconductor chip and the second semiconductor chip.

In accordance with one embodiment of a method for producing an electronic module, the method includes: providing at least one carrier having a first main surface, a second main surface situated opposite the first main surface, and side surfaces connecting the first and second main surfaces to one another. The method further includes connecting the at least one carrier to a first insulation layer, applying at least one semiconductor chip to the at least one carrier, wherein the semiconductor chip has contact elements, and connecting the first insulation layer, the at least one carrier and the at least one semiconductor chip to a second insulation layer.

The person skilled in the art will recognize additional features and advantages upon reading the following detailed description and upon giving consideration to the accompanying drawings.

BRIEF DESCRIPTION OF THE DRAWINGS

The accompanying drawings are included in order to impart a more thorough understanding of embodiments, and are included in this application and constitute part thereof. The drawings illustrate embodiments and together with the description serve for elucidating principles of embodiments. Other embodiments and many of the intended advantages of embodiments will become apparent when they are better understood with reference to the following detailed description. The elements in the drawings are not necessarily true to scale relative to one another. Identical reference numerals denote corresponding similar parts.

FIG. 2 shows a schematic cross-sectional side view illustration of an electronic module having an additional rear-side metallization in comparison with the module according to FIG. 1 in accordance with one example.

FIG. 3 shows a schematic cross-sectional side view illustration of an electronic module wherein the first insulation layer is given by a thermally conductive insulation layer, on which the carrier is applied.

FIG. 4, which includes

FIG. 5, which includes

FIG. 6, which includes

FIG. 7, which includes

DETAILED DESCRIPTION

Figure 1:
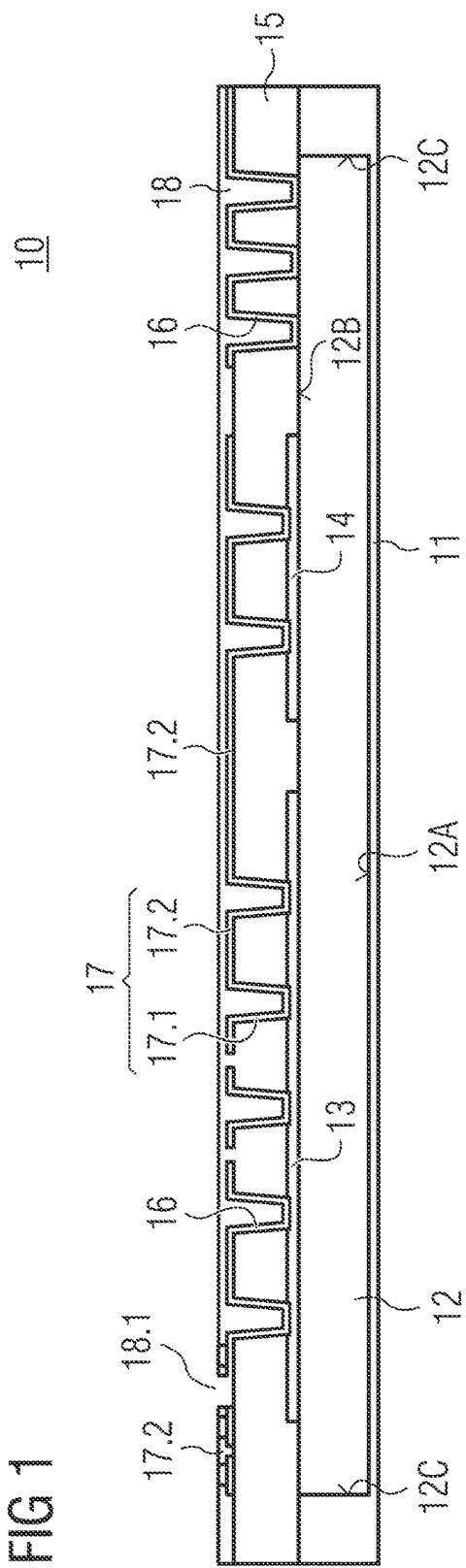
FIG. 1 shows a schematic cross-sectional side view illustration of an electronic module in accordance with one example.

The aspects and embodiments will now be described with reference to the drawings, wherein reference is made to identical elements generally using identical reference numerals throughout. In the following description, numerous specific details are set out for explanation purposes in order to provide a thorough understanding of one or more aspects of the embodiments. It may be obvious to the person skilled in the art, however, that one or more aspects of the embodiments can be practised with a smaller degree of the specific details. In other cases, known structures and elements are shown in schematic form in order to facilitate the description of one or more aspects of the embodiments. It goes without saying that other embodiments can be used and structural or logical changes can be made, without departing from the scope of protection of the present invention. It should furthermore be noted that the drawings are not true to scale or not necessarily true to scale.

In the following detailed description, reference is made to the accompanying drawings, which form part thereof and show as elucidation specific aspects of how the invention can be practised. In this respect, direction terminology such as, for instance, "top side," "underside," "front side," "rear side," etc. may be used with reference to the orientation of the figures described. Since component parts of components described can be positioned in a series of different orientations, the direction terminology serves for illustration purposes and is not restrictive in any way whatsoever. It goes without saying that other aspects can be used and structural or logical changes can be made, without departing from the scope of protection of the present invention. Therefore, the following detailed description should not be understood in a restrictive sense, and the scope of protection of the present invention is defined by the appended claims.

While one specific feature or one specific aspect of one embodiment may have been disclosed with regard to only one of a plurality of implementations, this feature or this aspect can additionally be combined with one or a plurality of other features or aspects of the other implementations, as may be desired or advantageous for any given or determined application. Furthermore, in as much as the expressions "contain," "have," "having" or other variants thereof are used either in the detailed description or in the claims, such expressions should be understood in a manner similar to the expression "comprise." The expressions "coupled" and "connected" can be used together with derivatives. It should be understood that these expressions can be used to indicate that two elements cooperate or interact with one another, regardless of whether they are in direct physical or electrical contact or they are not in direct contact with one another. Moreover, the expression "by way of example" is meant merely as an example instead of the best or optimum. Therefore, the following detailed description should not be understood in a restrictive sense, and the scope of protection of the present invention is defined by the appended claims.

The embodiments of an electronic module and of a method for producing an electronic module can use different types of transistor components. The embodiments can use transistor components embodied in semiconductor dies or semiconductor chips, wherein the semiconductor dies or semiconductor chips can be provided in the form of a block composed of semiconducting material, such as is produced from a semiconductor wafer and is diced from the semiconductor wafer, or in a different form in which further process steps have been performed, such as, for example, applying an encapsulation layer to the semiconductor die or the semiconductor chip. The embodiments can also use horizontal or vertical transistor components, wherein those structures can be provided in a form in which all the contact elements of the transistor component are provided on one of the main surfaces of the semiconductor die (horizontal transistor structures), or in a form in which at least one electrical contact element is arranged on a first main surface of the semiconductor die and at least one other electrical contact element is arranged on a second main surface opposite the main surface of the semiconductor die (vertical transistor structures), such as MOS transistor structures or IGBT structures (Insulated Gate Bipolar Transistor) for example.

In any case, the semiconductor dies or semiconductor chips can comprise contact elements or contact pads on one or more of their outer surfaces, wherein the contact elements serve for electrically contacting the semiconductor dies. The contact elements can have any desired shape or form. They can have the shape of contact pads, for example, i.e., flat contact layers on an outer surface of the semiconductor die. The contact elements or contact pads can consist of any electrically conductive material, for example of a metal such as aluminium, gold or copper, as an example, or a metal alloy or an electrically conductive organic material or an electrically conductive semiconductor material. The contact elements can also be formed as a layer stack made from one or a plurality of the abovementioned materials or as an NiMoP layer stack. All the materials mentioned can be deposited either electrolytically or in an electroless fashion.

The embodiments of an electronic module can comprise a first insulation layer and a second insulation layer. The material used in the first and second insulation layers can be any electrically insulating material such as, for example, any type of moulding material, any type of resin material or any type of epoxy material. The material can also be a polymer material, a benzoxazine material, a cyanate material, a polyimide material, a thermoplastic material, a silicone material, a ceramic material and a glass material. The material can also comprise any of the abovementioned materials and furthermore contain filling materials embedded therein, such as, for example, thermally conductive increments, in particular in the first insulation layer. These filling increments can consist for example of $Al_2O_3$, AlN, SiO, MgO, BeO, SiC, $TiO_2$, diamond, BN, SiN and/or $Si_3N_4$. Furthermore, the filling increments can have the shape of fibres or nanotubes. Furthermore, one or both of the first and second insulation layers can also be given by a thermally conductive insulation layer. Such a thermally conductive insulation layer can be given for example by a Cu-clad laminate, that is to say by a layer system composed of an insulation layer such as a boron nitride layer (thickness for example 20-300 μm), which is applied on a copper layer (thickness for example 10-300 μm). The thermally conductive insulation layer can also be given by a homogeneous layer of a (single) material. The thermally conductive insulation layer can, for instance, also contain a TIM (Thermal Interface Material) material or consist thereof and can be given in particular in the form of a TIM film.

In the claims and in the following description, various embodiments of a method for producing an electronic module are described as a specific sequence of processes or measures. It should be noted that the embodiments should not be restricted to the sequence specifically described. Certain or all of the various processes or measures can also be carried out simultaneously or in any other beneficial and expedient sequence.

FIG. 1 shows a schematic cross-sectional side view illustration of an electronic module in accordance with one example. The electronic module 10 in accordance with FIG. 1 comprises a first insulation layer in the form of a first encapsulation layer 11, at least one die pad 12, which is designated hereinafter as carrier 12, having a first main surface 12A, a second main surface 12B situated opposite the first main surface 12A, and side surfaces 12C connecting the first and second main surfaces 12A and 12B to one another, wherein the first main surface 12A and the side surfaces 12C are covered by the first encapsulation layer 11. The electronic module 10 furthermore comprises a first semiconductor chip 13, which is arranged on the second main surface 12B of the carrier 12, and a second semiconductor chip 14, which is likewise arranged on the second main surface 12B of the carrier 12. The first and second semiconductor chips 13 and 14 each have contact elements (not illustrated). The electronic module 10 furthermore comprises a second insulation layer in the form of a second encapsulation layer 15, which is arranged on the first encapsulation layer 11, the carrier 12 and the first and second semiconductor chips 13 and 14.

The electronic module 10 in accordance with FIG. 1 comprises two semiconductor chips 13 and 14. It is likewise possible for the electronic module to comprise exactly one semiconductor chip. It is likewise possible for the electronic module to comprise more than two semiconductor chips. The semiconductor chips can be transistor chips or diode chips, for example. One exemplary embodiment of an electronic module comprising eight semiconductor chips, namely four transistor chips and four diode chips, will be shown and explained further below.

The electronic module 10 in accordance with the exemplary embodiment in FIG. 1 comprises exactly one carrier 12. However, it is likewise possible for the electronic module to comprise more than one carrier. Exemplary embodiments in respect thereof are shown further below. Exactly one semiconductor chip or more than one semiconductor chip can be arranged on each carrier. The carriers can have identical or different sizes and/or thicknesses and have identical or different numbers of semiconductor chips fitted thereon. It is also possible to arrange different types of semiconductor chips on a carrier. In particular, transistor chips and diode chips can be arranged on a carrier.

In accordance with one exemplary embodiment of the electronic module 10 in FIG. 1, one or a plurality of the semiconductor chips have a thickness in a range of 5 µm to 1000 µm, in particular of 30 µm to 300 µm, in particular of 50 µm to 100 µm.

In accordance with one exemplary embodiment of the electronic module 10 in FIG. 1, the semiconductor chips 13 and 14 each comprise one or a plurality of a power transistor, a vertical transistor, a MOS transistor and an IGBT (Insulated Gate Bipolar Transistor). The semiconductor chips 13 and 14 can be based on Si, GaN, SiC or any other semiconductor material.

In accordance with one exemplary embodiment of the electronic module in FIG. 1, the first and second encapsulation layers 11 and 15 each comprise one or a plurality of a polymer material, a moulding compound or moulding material, a resin material, an epoxy resin material, an acrylate material, a benzoxazine material, a cyanate material, a polyimide material and a silicone-based material. One or both of the encapsulation layers 11 and 15 can also be given by a thermally conductive insulation layer in order to enable, in particular, thermal coupling to a heat sink in an optimum manner. Such a thermally conductive insulation layer can be given for example by a layer system composed of a boron nitride layer (thickness for example 100-200 µm) which is applied on a copper layer (thickness for example 100 µm). The thermally conductive insulation layer can also be given by a homogeneous layer of a material. The thermally conductive insulation layer can be formed by a TIM (Thermal Interface Material) material. The TIM material can contain, in particular, a material from the group silicone oil, silicone paste and silicone grease. The TIM material can furthermore contain a phase change material, a thermal grease material or a thermally conductive paste. Furthermore, the TIM material can be given in the form of a laminate, that is to say in particular as a TIM film. Specific exemplary embodiments in respect thereof are shown further below.

In accordance with one exemplary embodiment of the electronic module 10 in FIG. 1, the electronic module 10 comprises one or a plurality of half-bridge circuits, wherein two semiconductor transistor chips are connected in series in each half-bridge circuit. In particular, the semiconductor module 10 can comprise four semiconductor chips, wherein two respective semiconductor transistor chips are connected in series in order to form two half-bridge circuits.

In accordance with one exemplary embodiment of the electronic module 10 in FIG. 1, each individual one of the semiconductor transistor chips is connected in parallel with one of the semiconductor diode chips. In particular, the electronic module 10 can comprise four semiconductor transistor chips and four semiconductor diode chips, wherein each of them is connected in parallel with one of the semiconductor transistor chips.

In accordance with one exemplary embodiment of the electronic module 10 in FIG. 1, the semiconductor chips arranged on the electronic module 10 are connected in such a way that they form an AC/AC converter circuit, an AC/DC converter circuit, a DC/AC converter circuit, a frequency converter or a DC/DC converter circuit.

In accordance with one exemplary embodiment of the electronic module 10 in FIG. 1, the second encapsulation layer 15 has a thickness above the semiconductor chips in a range of 25 µm to 1000 µm.

In accordance with one exemplary embodiment of the electronic module 10 in FIG. 1, the second encapsulation layer 15 has electrical through connections 16 to the contact elements of the semiconductor chips 13 and 14. The electrical through connections 16 can in each case have through holes which extend from a main surface of the second encapsulation layer 15 as far as the contact elements or as far as the carrier 12, wherein a layer 17.1 of an electrically conductive material is introduced into the through holes. The layer 17.1 can be formed by a material deposited electrolytically or a material deposited in an electroless fashion. The layer 17.1 can be introduced into the through holes in such a way that the through holes are not completely filled with the material, and instead the material covers for example only the walls of the through holes with a thickness which is less than half of the diameter of the through holes. The through holes can have a diameter in a range of 50 µm to 500 µm. The layers 17.1 of the through holes are connected to horizontal layers 17.2 on the surface of the second encapsulation layer 16, wherein the layers 17.1 and the layers 17.2 may have been deposited during a single electrolytic deposition process, such that they form a continuous, homogeneous contact layer 17. The deposition process is explained in even greater detail further below in association with FIG. 4G.

In accordance with one exemplary embodiment of an electronic module 10 in FIG. 1, an insulation layer 18, which may be a solder resist layer, for example, is applied to the structured contact layer 17, and to that surface of the second encapsulation layer 16 which is not covered by the contact layer 17, and is introduced into the partly filled through holes. Openings 18.1 are introduced into the insulation layer 18 in order to enable electrical contacting from outside.

In accordance with one exemplary embodiment of an electronic module 10 in FIG. 1, the carrier 12 comprises an electrically conductive, in particular metallic, carrier, furthermore comprising in particular Cu or a Cu alloy or comprising a composite structure such as an Mo/Cu structure, an AlSiC structure, a Cu-diamond structure, or a Cu/carbon structure, or consists thereof. The carrier 12 can also be constructed from a plurality of layers or plies, wherein, in particular, metallic layer systems composed of Cu/Mo or Cu/Mo/Cu should be mentioned here.

In accordance with one exemplary embodiment of an electronic module 10 in FIG. 1, the carrier 12 has a thickness in a range of 0.1 mm to 5.0 mm.

In accordance with one exemplary embodiment of an electronic module 10 in FIG. 1, the first encapsulation layer 11 has a main surface facing away from the second encapsulation layer 15, wherein a thickness from the main surface of the encapsulation layer as far as the first main surface of the carrier is in a range of 10 µm to 1000 µm.

In accordance with one exemplary embodiment of an electronic module 10 in FIG. 1, the first encapsulation layer 11 comprises filling materials. The filling materials can be designed for increasing the thermal conductivity of the first encapsulation layer. These fillers can have the form of particles, which can consist, for example, of $Al_2O_3$, SiO, MgO, BeO, SiC, $TiO_2$, diamond, SiN or $Si_3N_4$, BN, TiO, or $SiO_2$. Furthermore, the filling increments can have the shape of fibres or nanotubes.

In accordance with one exemplary embodiment of an electronic module 10 in FIG. 1, the first encapsulation layer 11 has a thermal conductivity of greater than 3 W/mK, which is achieved in particular by the use of the fillers mentioned above. The first encapsulation layer 11 is intended to have the highest possible thermal conductivity without impairing its electrical insulation strength, in order that it can pass on as optimally as possible the heat generated by the semiconductor chips and dissipated from the (Cu) carrier and electrically insulates the carriers from one another to a sufficient extent.

In accordance with one exemplary embodiment of an electronic module 10 in FIG. 1, the first and second encapsulation layers 11 and 15 comprise different materials. In this case, the host materials and/or the fillers can be different. By way of example, the host material can be identical, that is to say can be given by an epoxy resin, for instance, but the fillers can be different. Whatever the case may be, these different materials can be chosen advantageously in accordance with the tasks to be fulfilled by the first and second encapsulation layers. While the first encapsulation layer 11, as set out above, is intended to have the highest possible thermal conductivity, the second encapsulation layer 15 is intended to be laser-ablatable as well as possible and/or to have good adhesive properties on the (Cu) carrier. By contrast, the thermal conductivity properties of the second encapsulation layer 15 are not of primary importance, and so said second encapsulation layer also need not contain special filling materials that increase the thermal conductivity. Consequently, the second encapsulation layer 15 can also be produced considerably more cost-effectively than the first encapsulation layer 11.

FIG. 2 shows a schematic cross-sectional side view illustration of an electronic module in accordance with one example. In terms of its essential features, the electronic module 20 in accordance with FIG. 2 corresponds to the electronic module 10 in FIG. 1. In contrast to the electronic module 10 in FIG. 1, a metallic layer 25 is applied on that main surface of the first encapsulation layer 11 which faces away from the second encapsulation layer 15. Said metallic layer can comprise Cu or a Cu alloy, for example. It can serve to facilitate contact connection to a heat sink. Its deposition can take place at the same time as the deposition of the metallic layer in the through holes of the second encapsulation layer 15.

FIG. 3 shows a schematic cross-sectional side view illustration of an electronic module in accordance with one example. The electronic module 30 in accordance with FIG. 3 corresponds in part to the electronic module 10 in FIG. 1. In contrast to the electronic module 10 in FIG. 1, the first insulation layer here is designated by the reference sign 35 and given by a thermally conductive insulation layer as described above, on which the carrier 12 is applied. With regard to the materials of the thermally conductive insulation layer, the same explanations as further above concerning the module in FIG. 1 are applicable. In FIG. 3, the thermally conductive insulation layer 35 is illustrated as a homogeneous layer both in the lateral direction and in the vertical direction. However, it is likewise possible for the thermally conductive insulation layer to be embodied inhomogeneously in the lateral direction, namely in so far as it is embodied as a thermally conductive insulation layer only in a region situated below the carrier 12, but has other properties laterally outside that. As in the module in FIG. 1, the second insulation layer 15 can be given by a moulding or epoxy layer or likewise by a thermally conductive insulation layer. At the side surfaces 12C, the carrier 12 is surrounded by a moulding material 36. One possible production method is described further below in FIGS. 5A-D. It is also conceivable for the carrier 12 to be surrounded by the second encapsulation layer 15 at the side surfaces 12C, one possible production method being described further below in FIGS. 6A-C.

FIGS. 4A-I show schematic cross-sectional side view illustrations for elucidating a method for producing a plurality of electronic modules by applying two moulding materials.

Figure 4A:
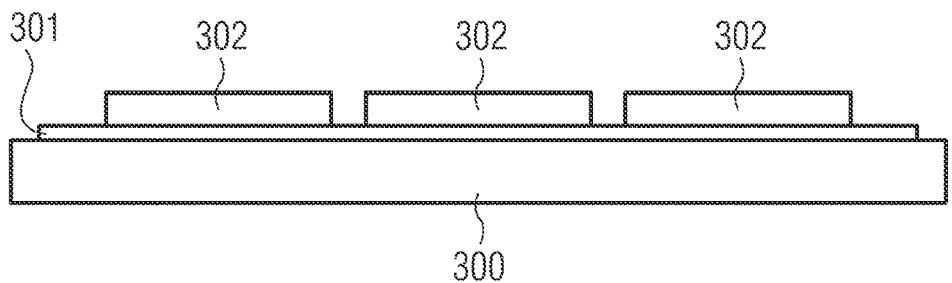
FIGS. 4A-H, shows schematic cross-sectional side view illustrations for elucidating a method for producing a plurality of electronic modules wherein the carriers are embedded into a first moulding material and a second moulding material is the applied after the chips have been applied.

In accordance with FIG. 4A, a carrier system is provided, which comprises for example an auxiliary carrier 300 and a thermo-release film 301 applied thereon. Instead of a thermo-release film, a film releasable by UV irradiation or a film releasable by chemical treatment can also be used. A plurality of die pads 302, referred to as carriers 302 hereinafter, are then applied on said film. The auxiliary carrier 300 can have the form of a wafer or alternatively also a square or rectangular form. By way of example, three carriers 302 are illustrated, which are intended to belong to an electronic module to be produced, for example. Corresponding arrangements of three carriers are then fixed in the form of a regular arrangement on the auxiliary carrier 300 or the thermo-release film 301. In this way, a plurality of identical electronic modules are produced by parallel processing.

Figure 4B:
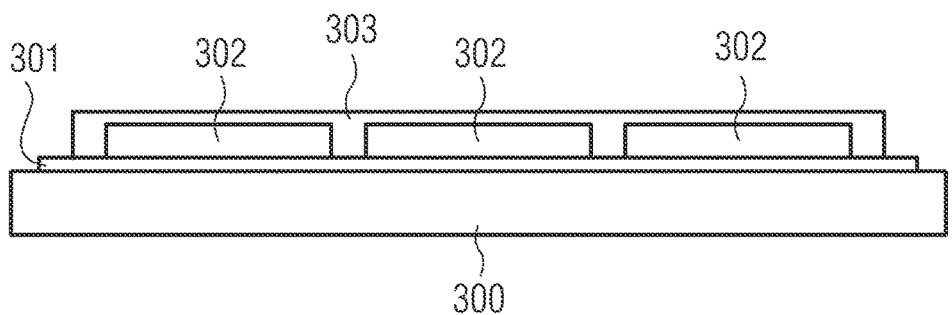

In accordance with FIG. 4B, a first moulding process is then carried out, wherein the first encapsulation layer 303 is produced, which corresponds to the first encapsulation layer 11 of the electronic modules 10 and 20 shown in FIGS. 1 and 2. The moulding process is accordingly carried out in such a way, for example by compression moulding, that the encapsulation layer 303 covers the carriers 302 on a first of two opposite main surfaces and the side surfaces and the thickness of the encapsulation layer 303 above the first main surface of the carriers 302 is in a range of 10 µm to 1000 µm.

Figure 4C:
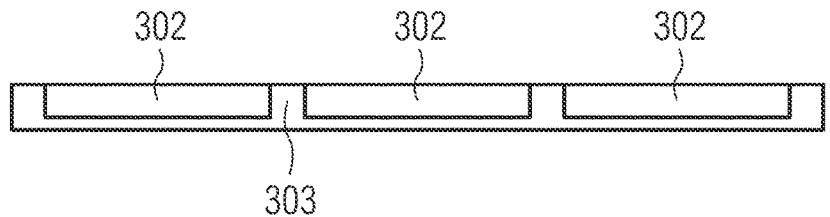

In accordance with FIG. 4C, after the first encapsulation layer 303 has been cured, the auxiliary carrier 300 with the thermo-release film 301 is then removed by the action of heat, such that an encapsulated carrier system in the form of the cured first encapsulation layer 303 with the embedded carriers 302 remains. In the illustration of the encapsulated carrier system in FIG. 4C, the underside of said carrier system has been turned upwards, such that the exposed surfaces of the carriers 302 lie at the upper surface.

Figure 4D:
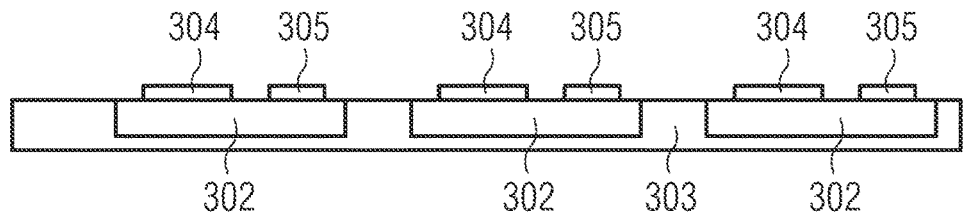

In accordance with FIG. 4D, semiconductor chips 304 and 305 are then applied to the carriers 302. The semiconductor chips 304 and 305 have contact pads (not illustrated) at their upper surface and, if appropriate, also at their lower surface. The semiconductor chips 304 and 305 can contain active and passive semiconductor components. In the example illustrated, semiconductor chips 304 and 305 of different types are used, which can be for example transistor chips 304, in particular IGB transistors, and diode chips 305. The semiconductor chips 304 and 305 can be applied to the carrier 302 by various methods, including sintering, adhesive bonding, soldering, in particular diffusion soldering or the ADS method (Advanced Diffusion Soldering). Provision can also be made for the semiconductor chips 304 and 305 to be applied to the carriers 302 in an earlier stage, such that, as early as in the first step in FIG. 4A, for example, the carriers 302 equipped with semiconductor chips 304 and 305 are applied to the carrier system.

Figure 4E:
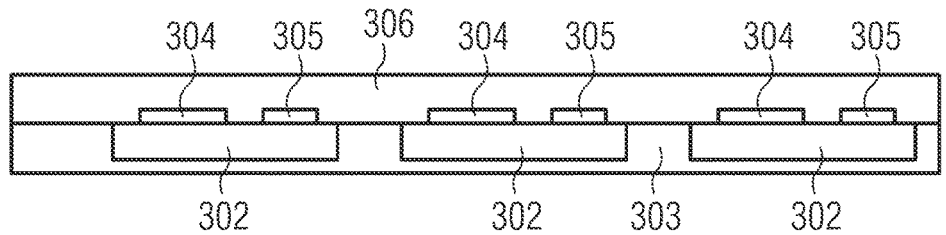

In accordance with FIG. 4E a second encapsulation layer 306 is applied to the first encapsulation layer 303, the carriers 302 and the semiconductor chips 304 and 305. The second encapsulation layer 306 corresponds to the second encapsulation layer 15 of the electronic modules 10 and 20 shown in FIGS. 1 and 2.

Figure 4F:
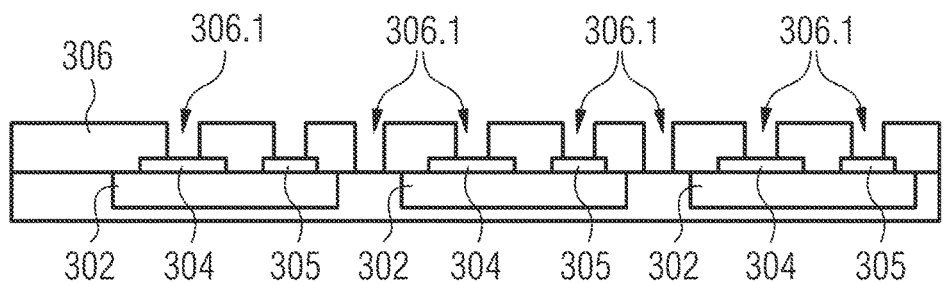

In accordance with FIG. 4F, through holes 306.1 are introduced into the second encapsulation layer 306 by laser drilling. The through holes 306.1 extend either as far as the contact elements of the semiconductor chips 304 and 305 or as far as the carriers 302.

Figure 4G:
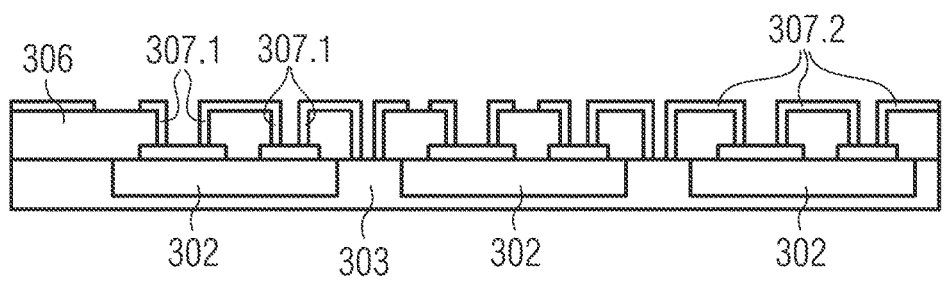

In accordance with FIG. 4G, a conductive layer 307.1 is introduced into the through holes 306.1 and, at the same time, a conductive layer 307.2 is applied on the surface of the second encapsulation layer 306, wherein Cu or a Cu alloy can be chosen as metal in both cases. The deposition can be carried out by means of a subtractive deposition method, for example, wherein a metal layer is firstly deposited over the whole area both on the surface of the second encapsulation layer 306 and simultaneously in the through holes 306.1 and said metal layer is subsequently patterned photolithographically, such that it remains only in the region of the through holes and of the desired contact pads. However, an additive deposition method can likewise be used, wherein, for instance by the use of masks, a deposition is carried out only in the desired regions from the outset.

The deposition of the metallic layer can be carried out by various methods, for example by an electrolytic deposition process, by an electroless deposition process or by a sputtering process. In the case of electrolytic deposition, firstly an electrically conductive seed layer has to be deposited onto the surface of the second encapsulation layer 306 and into the through holes 306.1. Said seed layer can advantageously be chosen such that it fulfils an additional function as adhesion promoter between the second encapsulation layer 306 and the metallic layer, for which purpose a conductive organic adhesion promoter constructed from an organic material with metallic particles is best suited. The seed layer can have a thickness in a range of 1 nm to 10 nm. It can also prove to be advantageous to roughen the surface of the second encapsulation layer 306 before the seed layer is applied, since the adhesion of the Cu metal layer can be improved particularly when filling particles such as $SiO_2$ particles are present in the second encapsulation layer 306.

Figure 4H:
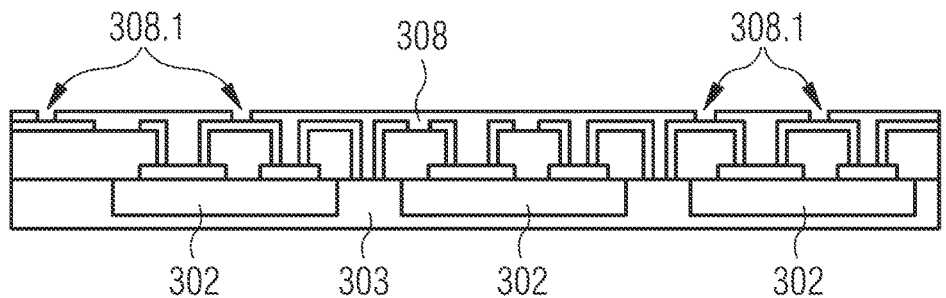

In accordance with FIG. 4H, after the production of the electrical contact pads 307.2, an insulation layer 308 such as a solder resist layer is applied to the electrical contact pads 307.2 and to the intervening surface of the second encapsulation layer 306. Said insulation layer 308 is subsequently structured in order to expose the electrical contact pads 307.2 at specific selected locations 308.1 towards the outside, in order to enable electrical contacting from outside. The exposed contact surfaces can then also either be passivated, for example with NiAu, OSP or the like, and/or be provided with solder deposits or contact elements such as sleeves or pins.

Afterwards, the structure obtained can then be singulated into individual electronic modules.

FIGS. 5A-D show schematic cross-sectional side view illustrations for elucidating a method for producing a plurality of electronic modules using at least one thermally conductive insulation layer.

In accordance with FIG. 5A, an auxiliary carrier 500 is provided, on which a plurality of die pads 502, once again referred to as carriers 502 hereinafter, are then applied. The auxiliary carrier 500 can have the form of a wafer or alternatively also a square or rectangular form.

Figure 5A:
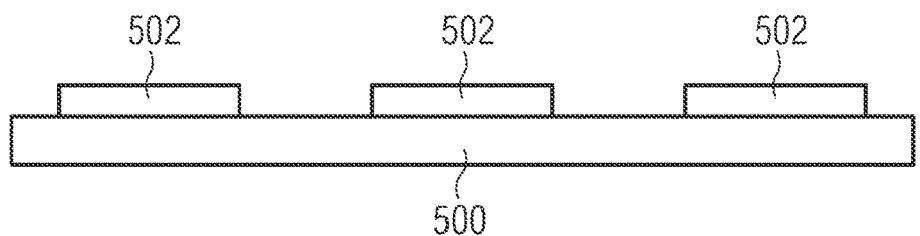
FIGS. 5A-E, shows schematic cross-sectional side view illustrations for elucidating a method for producing a plurality of electronic modules wherein the carriers are connected to one another by a moulding material and at least one thermally conductive insulation layer is then applied after the chips have been applied.
Figure 5B:
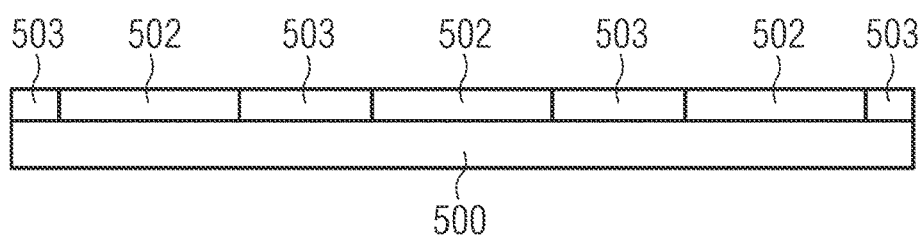

In accordance with FIG. 5B, a moulding compound 503 is applied to the structure shown in FIG. 5A, for example by transfer moulding, and the carriers 502 are embedded therein in such a way that the moulding compound 503 is situated only between the carriers 502. The moulding compound 503 can also be applied by compression moulding, wherein the moulding compound situated above the carriers 502 has to be removed after curing in this case.

Figure 5C:
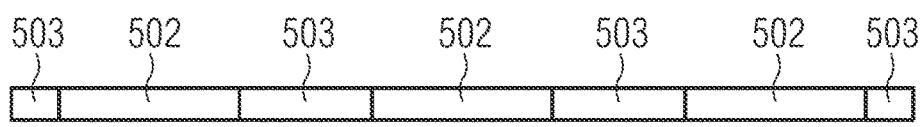

In accordance with FIG. 5C, the auxiliary carrier 500 is removed after the moulding compound 503 has been cured, such that carriers 502 exposed on both sides are obtained. The structure is now held together by the cured moulding compound 503 situated between the carriers 502.

Figure 5D:
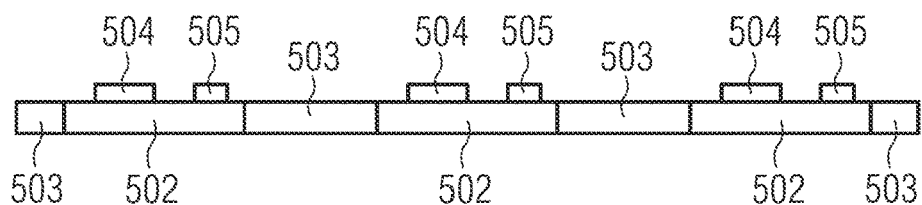

In accordance with FIG. 5D, semiconductor chips 504 and 505 are then applied to the carriers 502, as has already been described further above with reference to FIG. 4D, wherein here, too, the semiconductor chips 504 and 505 can also already have been applied to the carriers 502 in an earlier stage.

Figure 5E:
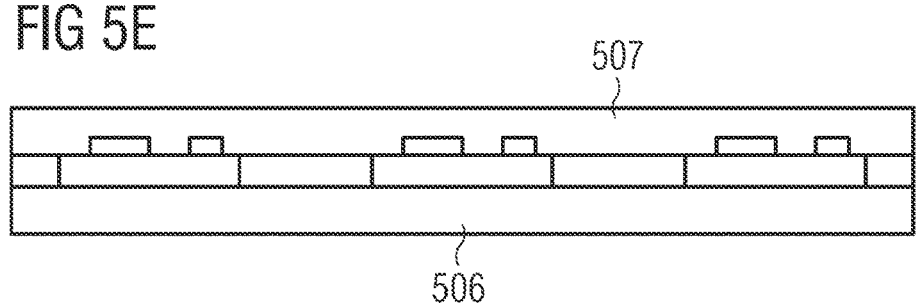

In accordance with FIG. 5E, thermally conductive insulation layers 506 and 507 are then applied to the structure on both sides of the structure. Alternatively, it is also possible, after the step in FIG. 5B, in the case of compression moulding, not to remove the moulding compound 503 above the carriers 502 and, in the step in FIG. 5E, to apply only one thermally conductive insulation layer to the lower surface of the structure.

The steps as described in FIGS. 4F-H can subsequently be carried out.

Figure 6A:
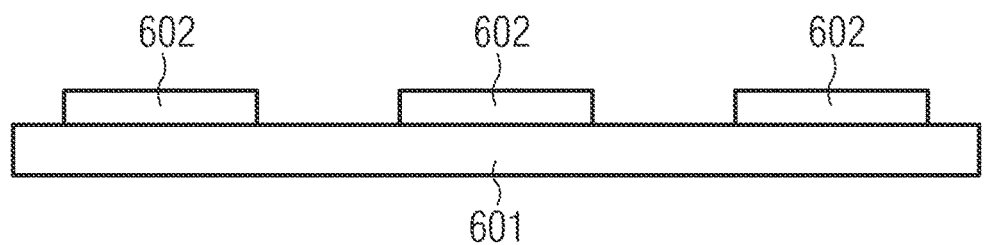
FIGS. 6A-C, shows schematic cross-sectional side view illustrations for elucidating a method for producing a plurality of electronic modules wherein the carriers are applied to a thermally conductive insulation layer and either a further thermally conductive insulation layer or a moulding material is then applied after the chips have been applied.
Figure 6B:
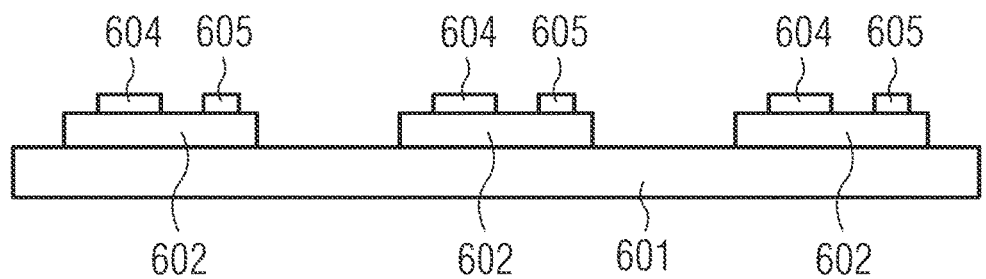
Figure 6C:
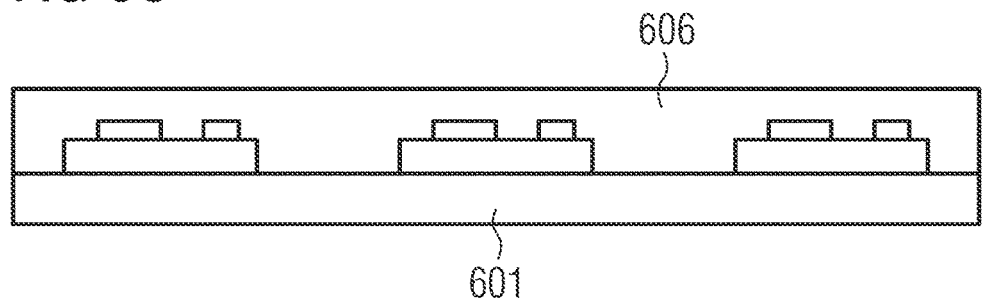

FIGS. 6A-C show schematic cross-sectional side view illustrations for elucidating a method for producing a plurality of electronic modules wherein the carriers are applied to a thermally conductive insulation layer.

In accordance with FIG. 6A, a first thermally conductive insulation layer 601 is provided, on which a plurality of carriers 602 are then applied.

In accordance with FIG. 6B, semiconductor chips 604 and 605 are then applied to the carriers 602, as has already been described further above with reference to FIG. 4D.

In accordance with FIG. 6C, a second thermally conductive insulation layer 606 is then applied to the upper surface of the structure, that is to say to the first thermally conductive insulation layer 601, the carriers 602 and the chips 604 and 605.

The steps as described in FIGS. 4F-H can subsequently be carried out.

Figure 7A:
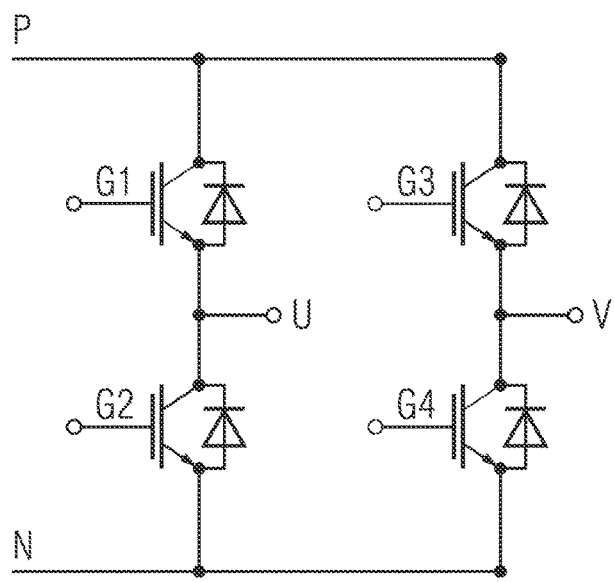
FIGS. 7A and 7B, shows a schematic circuit illustration of a semiconductor converter circuit comprising four transistors and four diodes (A), and an electronic module containing such a semiconductor converter circuit.

Referring to FIGS. 7A,B, a circuit diagram of a semiconductor converter circuit (A) and an electronic module (B) containing such a semiconductor converter circuit are illustrated schematically.

The circuit design shown in FIG. 7A constitutes a so-called four-quadrant controller. A four-quadrant controller consists of an H-bridge circuit composed of four semiconductor switches, transistors in the present case, which can convert a DC voltage into an AC voltage of variable frequency and variable pulse width and which can be used for example for driving an electric motor. The H-bridge circuit consists of two times two series-connected transistors each with a reverse-biased freewheeling diode. The DC motor to be controlled lies in the centre between the two halves, that is to say between the terminals designated by U and V.

In specific detail, the circuit comprises four transistors G1-G4, each of which is connected in parallel with one of four diodes D1-D4. The circuit is subdivided into two half-bridge circuits. In particular, a first half-bridge circuit is formed by a series circuit comprising the transistors G1 and G2, which supply a first current U to a node between the transistors G1 and G2, and a second half-bridge circuit is formed by a series circuit comprising the transistors G3 and G4, which supply a second current V to a node between the transistors G3 and G4. The drain contacts of the transistors G1 and G3 of the two half-bridge circuits are connected to a common potential P. The source contacts of the respective other transistors G2 and G4 of the two half-bridge circuits are connected to a common potential P.

Figure 7B:
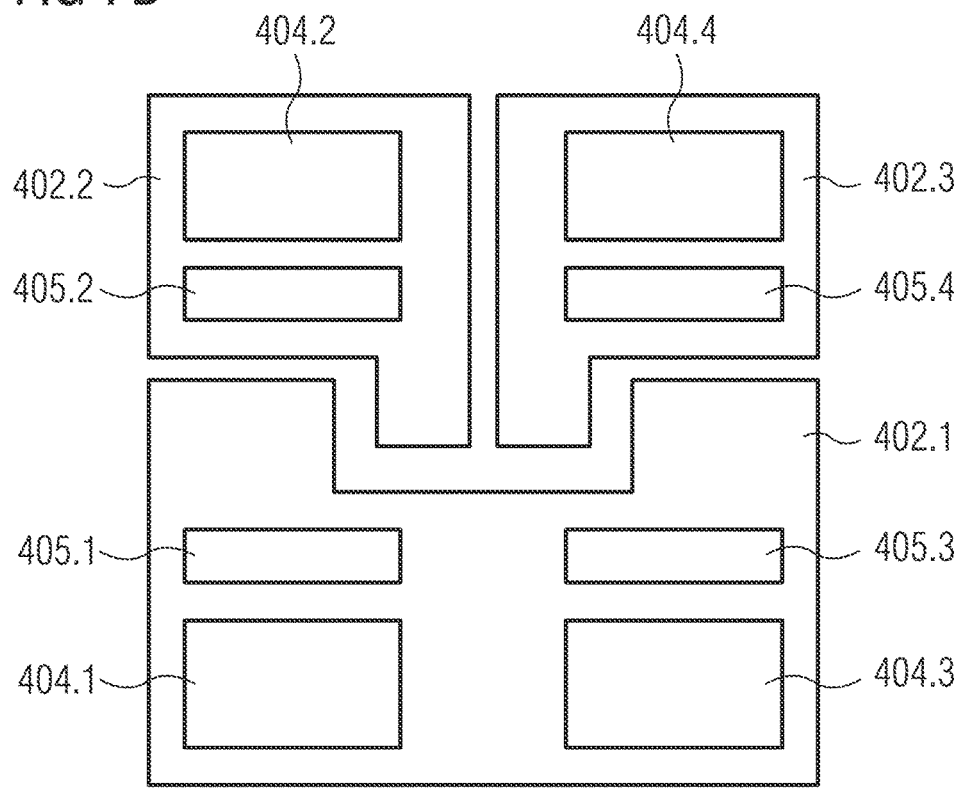

The electronic module 400 shown in FIG. 7B shows how the circuit according to FIG. 7A is constructed. Three carriers (copper blocks) 402.1, 402.2 and 402.3 are used for each module, which carriers are embedded into a first insulation layer in the manner shown in FIGS. 3A-C. Transistor chips 404.1, 404.2, 404.3 and 404.4 and diode chips 405.1, 405.2, 405.3 and 405.4 are applied to these three carriers 402.1, 402.2 and 402.3, as shown in FIG. 3D. The transistor chips are constructed as insulated gate-body transistors (IGBTs), that is to say have gate and source contacts on a first main surface and a drain contact on a second main surface. The transistor chips 404.1 and 404.3 correspond to the transistors G1 and G3 in the circuit diagram in FIG. 3 and are applied on the common carrier 402.1, which is at the potential of the common drain contact of the transistor chips 404.1 and 404.3. The same applies to the diodes D1 and D3 respectively connected in parallel with the transistors G1 and G3, said diodes corresponding to the diode chips 405.1 and 405.3 in FIG. 4B. The transistor chips 404.2 and 404.4 in turn correspond to the transistors G2 and G4 in the circuit diagram in FIG. 3 and are applied on the two carriers 402.2 and 402.3 electrically insulated from one another, since their drain contacts, as evident in the circuit diagram in FIG. 3, are at different electrical potentials. However, the source contacts of the transistors G2 and G4 are at the same electrical potential. Accordingly, a continuous contact pad is deposited above the transistor chips 404.2 and 404.4, both source terminals of these transistors being connected to said contact pad. The contact pad corresponds to one of the contact pads 307.2 whose production was described in association with FIG. 3G. The source terminals of the transistors G1 and G3 are not at the same electrical potential, however, such that two contact pads electrically insulated from one another are deposited above the corresponding transistor chips 404.1 and 404.3, a source terminal of one of the transistor chips 404.1 and 404.3 being connected to each of said contact pads.

A plurality of electronic modules, as shown in FIG. 7B, can be produced simultaneously in the production method in FIGS. 4A-I. For this purpose, as shown in FIG. 4A, the carriers associated with the individual modules are arranged in a matrixlike manner alongside one another and one below another on a waferlike auxiliary carrier 300 by means of the thermo-release film 301 and are processed further as described.

Even though the invention has been illustrated and described with regard to one or a plurality of implementations, alterations and/or modifications to the examples illustrated can be made, without departing from the concept and scope of protection of the appended claims. Especially with regard to the various functions performed by the above-described component parts or structures (assemblies, components, circuits, systems, etc.), the expressions used (including any reference to a "means") which are used for describing such component parts, unless indicated otherwise, are intended to correspond to any component part or structure which performs the specified function of the described component part (which is e.g., functionally equivalent), even though not structurally equivalent to the disclosed structure which performs the function in the exemplary implementations of the invention as illustrated herein.

The invention claimed is:

1. An electronic module, comprising
   at least one electrically conductive carrier having a first main surface, a second main surface situated opposite the first main surface, and side surfaces connecting the first and second main surfaces to one another;
   a first insulation layer formed around the carrier such that the first main surface and the side surfaces of the carrier are enclosed by the first insulation layer;
   at least one semiconductor chip arranged on the second main surface of the carrier, wherein the semiconductor chip has contact elements; and
   a second insulation layer, which is arranged on the at least one carrier and the at least one semiconductor chip,
   wherein the second insulation layer has electrical through connections to the contact elements and/or to the carrier,
   wherein the electrical through connections are formed in through holes extending from a main surface of the second insulation layer to the contact elements and/or to the carrier, wherein the electrical through connections comprise an electrically conductive layer that covers the walls of the through holes, and wherein the through holes are not completely filled by the electrically conductive layer, and wherein the first and second insulation layers are both formed from epoxy-based encapsulation materials, and wherein the main surface of the second insulation layer is an outermost surface of epoxy-based encapsulation material for the electronic module.

2. The electronic module according to claim 1, wherein the carrier comprises Cu or a Cu composite material.

3. The electronic module according to claim 1, wherein a thickness of the first insulation layer as measured between a first surface that directly adjoins the second insulation layer and a second surface that is opposite from the first surface is in a range of 10 µm to 1000 µm.

4. The electronic module according to claim 1, wherein the first insulation layer comprises a thermally conductive Cu-clad laminate.

5. The electronic module according to claim 4, wherein the first insulation layer comprises one or more of the following filling materials: $Al_2O_3$, SiO, MgO, BeO, SiC, $TiO_2$, diamond, SiN or $Si_3N_4$, BN, TiO, or $SiO_2$.

6. The electronic module according to claim 1, wherein the first and second insulation layers comprise different materials.

7. The electronic module according to claim 1, wherein the through holes are filled with an insulation layer that is disposed between the electrically conductive layer.

8. The electronic module according to claim 1, wherein the electronic module is devoid of semiconductor chips disposed on or above the main surface of the second insulation layer.

9. An electronic module, comprising
a carrier having a first main surface and a second main surface situated opposite the first main surface, and side surfaces connecting the first main surface and the second main surface;
a first semiconductor chip, which is arranged on the second main surface of the carrier;
a second semiconductor chip, which is arranged on the second main surface of the carrier;
a first insulation layer, on which the carrier is applied; and
a second insulation layer, which is arranged on the carrier, the first semiconductor chip and the second semiconductor chip, wherein the first insulation layer is formed around the carrier such that the first main surface and the side surfaces of the carrier are enclosed by the first insulation layer, wherein the second insulation layer has electrical through connections to the first semiconductor chip and the second semiconductor chip, wherein the electrical through connections are formed in through holes extending from a main surface of the second insulation layer to the first semiconductor chip and the second semiconductor chip, wherein the electrical through connections comprise an electrically conductive layer that covers the walls of the through holes, and wherein the through holes are not completely filled by the electrically conductive layer, and wherein the first and second insulation layers are both formed from epoxy-based encapsulation materials, and wherein the main surface of the second insulation layer is an outermost surface of epoxy-based encapsulation material for the electronic module.

10. The electronic module according to claim 9, wherein the first insulation layer has a main surface facing away from the second insulation layer and a metallic layer being applied to said main surface.

11. The electronic module according to claim 9, wherein the first insulation layer comprises a thermally conductive Cu-clad laminate.

12. The electronic module according to claim 9, wherein the first insulation layer directly contacts the first main surface and the side surfaces of the carrier.

13. The electronic module according to claim 9, wherein the through holes are filled with an insulation layer that is disposed between the electrically conductive layer.

14. The electronic module according to claim 9, wherein the electronic module is devoid of semiconductor chips disposed on or above the main surface of the second insulation layer.

* * * * *